(12) United States Patent
Graves-Abe et al.

(10) Patent No.: US 8,927,427 B2
(45) Date of Patent: Jan. 6, 2015

(54) ANTICIPATORY IMPLANT FOR TSV

(71) Applicant: International Business Machines Corporation, Armonk, NY (US)

(72) Inventors: Troy L. Graves-Abe, Wappingers Falls, NY (US); Brian J. Greene, Wappingers Falls, NY (US); Chandrasekharan Kothandaraman, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/872,371

(22) Filed: Apr. 29, 2013

(65) Prior Publication Data

US 2014/0319694 A1    Oct. 30, 2014

(51) Int. Cl.
*H01L 21/44* (2006.01)
*H01L 21/768* (2006.01)
*H01L 23/48* (2006.01)

(52) U.S. Cl.
CPC ........ *H01L 21/76877* (2013.01); *H01L 23/481* (2013.01)
USPC ........... 438/667; 438/700; 438/143; 438/471; 257/621; 257/698; 257/774; 257/E23.011; 257/E23.174; 257/E21.597

(58) Field of Classification Search
CPC ............ H01L 21/76898; H01L 23/481; H01L 2225/06541

USPC .......... 438/667, 700, 143, 471; 257/621, 698, 257/774, E23.011, E23.174, E21.597
See application file for complete search history.

(56) References Cited

U.S. PATENT DOCUMENTS

| 4,830,971 | A | 5/1989 | Shibata |
| 7,943,514 | B2 | 5/2011 | West |
| 8,093,089 | B2 | 1/2012 | Noh |
| 8,093,090 | B1 | 1/2012 | Pio |
| 8,193,039 | B2 | 6/2012 | Su et al. |
| 2004/0129977 | A1* | 7/2004 | Ohkubo et al. ............... 257/347 |
| 2007/0007532 | A1* | 1/2007 | Kang et al. ...................... 257/67 |
| 2009/0212438 | A1 | 8/2009 | Kreupl et al. |
| 2011/0110062 | A1 | 5/2011 | Park et al. |
| 2011/0187000 | A1 | 8/2011 | West |
| 2012/0098122 | A1 | 4/2012 | Yang |
| 2012/0258594 | A1* | 10/2012 | Barth et al. .................... 438/667 |
| 2013/0099312 | A1* | 4/2013 | Dao et al. ....................... 257/335 |

* cited by examiner

*Primary Examiner* — Tu-Tu Ho
(74) *Attorney, Agent, or Firm* — L. Jeffrey Kelly; Steven Meyers

(57) ABSTRACT

A method including introducing a dopant into a region of a substrate, etching a deep trench in the substrate through the region, gettering impurities introduced during etching of the deep trench using a pentavalent ion formed from a reaction between an element of the substrate and the dopant, wherein the charge of the pentavalent ion attracts the impurities, and filling the deep trench with a conductive material.

20 Claims, 2 Drawing Sheets

ANTICIPATORY IMPLANT FOR TSV

BACKGROUND

1. Field of the Invention

The present invention generally relates to 3D chip assemblies, and more particularly to an anticipatory implant technique to reduce contamination during through-substrate via formation.

2. Background of Invention

Advancements in the area of semiconductor fabrication have enabled the manufacturing of integrated circuits that have a high density of electronic components. A challenge arises where an increase in the number and length of interconnect wirings can cause an increase in circuit resistance-capacitance delay and power consumption, which can negatively impact circuit performance. Three-dimensional (3D) stacking of integrated circuits can address these challenges. Fabrication of 3D integrated circuits includes at least two silicon wafers stacked vertically. Vertically stacked wafers can reduce interconnect wiring length and increase semiconductor device density. Deep through-substrate vias (TSVs) may be formed to provide interconnections and electrical connectivity between the electronic components of the 3D integrated circuits. Such TSVs may require high aspect ratios, where the via height is large with respect to the via width, to save valuable area in an integrated circuit design. Therefore, semiconductor device density can be increased and total length of interconnect wiring may be decreased by incorporating TSVs in 3D integrated circuits.

In order to form an electrical connection between the components of two wafers, stacked one on top of the other, a TSV may extend through the entire thickness of a single wafer. More specifically, a TSV may extend through multiple interconnect levels and through a semiconductor substrate (hereinafter "substrate") in which semiconductor devices (hereinafter "devices") may be formed. The interconnect levels may generally be located above the substrate, and may include multiple connections to and between the devices formed in the substrate.

A deep trench may typically be etched into the wafer through the interconnect levels and through the substrate in order to form the TSV. The devices formed in the substrate may be exposed to impurities as a result of etching through the interconnect levels. These impurities may diffuse into the substrate, and collect below the devices. More specifically, the impurities tend to migrate in dielectric materials, such as, for example a dielectric TSV liner or a buried oxide layer of a silicon-on-insulator substrate. A concentration of impurities below a device may affect the operational characteristics of that device, for example the threshold voltage. An unwanted change in the threshold voltage of a particular device may undermine the functionality of that device.

Accordingly, it may be advantageous to address the deficiencies described above.

SUMMARY

According to one embodiment of the present invention, a method is provided. The method may include implanting a region of a substrate with a dopant, and forming a through-substrate via in the substrate adjacent to a device, the through-substrate via passing through the region.

According to another exemplary embodiment, a method is provided. The method may include implanting, simultaneously, a region of a substrate and a source-drain region of an n-type device with a dopant, the region being adjacent to a p-type device, and forming a through-substrate via in the substrate, the through-substrate via passing through the region.

According to another exemplary embodiment, a structure is provided. The structure may include a substrate including a region, the region including a dopant and oxygen, and a through-substrate via extending from a top surface of the substrate to a bottom surface of the substrate, and through the region.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which:

FIG. 1 illustrates the formation of two devices in the substrate and implanting the substrate with a dopant according to one embodiment.

FIG. 2 illustrates the formation of a dielectric layer, a barrier layer, and an interconnect level according to one embodiment.

FIG. 3 illustrates the formation of a deep trench according to one embodiment.

FIG. 4 illustrates the formation of a TSV and the final structure according to one embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Impurities may be introduced into the semiconductor substrate (hereinafter "substrate") during fabrication of a through-substrate via (hereinafter "TSV"). More specifically, the substrate may be exposed to impurities during etching of a deep trench to form the TSV. The impurities may include any material deemed to be detrimental to the operation of semiconductor devices (hereinafter "devices") formed in the substrate. In some cases, the impurities may originate from processing of one or more interconnect levels formed above the substrate after formation of the devices. In one embodiment, the impurities may include sodium, potassium, and copper which may remain after processes such as chemical mechanical polishing used to fabricate the interconnect levels. More specifically, the impurities may contaminate the substrate by diffusing into dielectric materials within the substrate and negatively affect the operation of nearby devices formed in the substrate. In some cases, the impurities may change the threshold voltage of a particular device thereby detrimentally affecting that device's functionality.

The present invention generally relates to 3D chip assemblies, and more particularly to an anticipatory implant technique to reduce substrate contamination during TSV formation. Ideally, TSVs should be fabricated without contaminating the substrate and without negatively affecting the operation of the devices. One way to successfully fabricate a TSV without contaminating the substrate may be to introduce a dopant designed to form a gettering agent to limit or prevent the diffusion of impurities into the substrate, and prevent contamination of the substrate. One exemplary embodiment by which to ensure the successful formation of a TSV without contaminating the substrate is described in detail below by referring to the accompanying drawings FIGS. 1-4. In the present embodiment, a region of the substrate may be implanted with a dopant which may react with elements of the substrate to form a gettering agent used to attract the impurities and prevent or limit their diffusion into the substrate.

Figure 1:
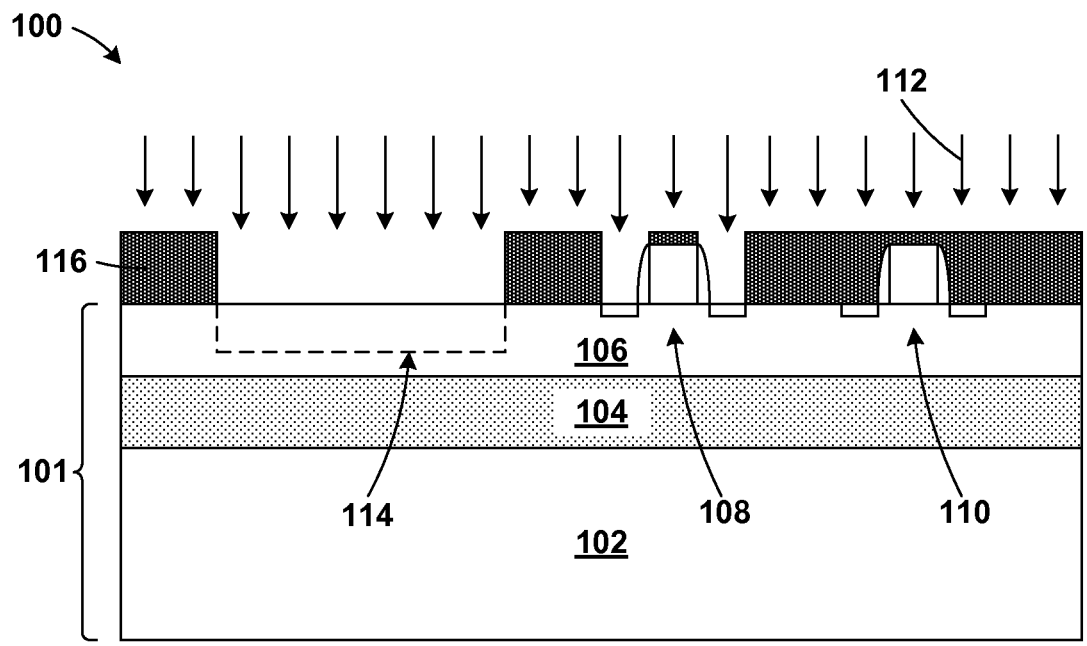
FIGS. 1-4 illustrate the steps of a method prevent contaminants from being introduced into a substrate during the formation of a through-substrate via (TSV) according to one embodiment.

Referring now to FIG. 1, a cross section view of a semiconductor structure 100 ("structure 100") is shown. The structure 100 may include a substrate including a bulk semiconductor or a layered semiconductor such as Si/SiGe, a silicon-on-insulator (SOI), or a SiGe-on-insulator (SGOI). Bulk substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. In the embodiment shown in FIG. 1 a SOI substrate 101 may be used. The SOI substrate 101 (hereinafter "substrate") may include a base substrate 102, a buried dielectric layer 104 formed on top of the base substrate 102, and a SOI layer 106 formed on top of the buried dielectric layer 104. The buried dielectric layer 104 may isolate the SOI layer 106 from the base substrate 102.

The base substrate 102 may be made from any of several known semiconductor materials such as, for example, silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Typically, the base substrate 102 may be about, but is not limited to, several hundred microns thick. For example, the base substrate 102 may have a thickness ranging from 0.5 mm to about 1.5 mm.

The buried dielectric layer 104 may include any of several dielectric materials, for example, oxides, nitrides and oxynitrides of silicon. The buried dielectric layer 104 may also include oxides, nitrides and oxynitrides of elements other than silicon. In addition, the buried dielectric layer 104 may include crystalline or non-crystalline dielectric material. Moreover, the buried dielectric layer 104 may be formed using any of several known methods, for example, thermal or plasma oxidation or nitridation methods, chemical vapor deposition methods, and physical vapor deposition methods. The buried dielectric layer 104 may have a thickness ranging from about 5 nm to about 200 nm. In one embodiment, the buried dielectric layer 104 may have a thickness ranging from about 150 nm to about 180 nm.

The SOI layer 106 may include any of the several semiconductor materials included in the base substrate 102. In general, the base substrate 102 and the SOI layer 106 may include either identical or different semiconducting materials with respect to chemical composition and dopant concentration. In one embodiment, the SOI layer 106 may include a thickness ranging from about 5 nm to about 100 nm. In another embodiment, the SOI layer 106 may have a thickness ranging from about 25 nm to about 30 nm. Methods for forming the SOI layer 106 are well known in the art. Non-limiting examples include SIMOX (Separation by Implantation of Oxygen), wafer bonding, and ELTRAN® (Epitaxial Layer TRANsfer).

The SOI layer 106 may be doped, undoped or contain both doped and undoped regions therein. These doped regions are known as "wells" and can be used to define various device regions, for example a source-drain region. The source-drain region, for example, may be either n-doped or p-doped. Typically, an n-doped source-drain region may be used to form n-type field effect transistors (n-FETs), and a p-doped source-drain region may be used to form p-type field effect transistors (p-FETs). However, the source-drain region of one device on a substrate may be n-doped while the source-drain regions of another device on the same substrate may be p-doped. In one embodiment, the substrate may include all n-FET devices. In one embodiment, the substrate may include all p-FET devices. In one embodiment, the substrate may include some combination of n-FET and p-FET devices.

With continued reference to FIG. 1, one or more devices, for example an n-FET 108 and a p-FET 110, may be formed in the SOI layer 106 of the substrate 101. The n-FET 108 and a p-FET 110 may be fabricated using any technique known in the art, for example, gate first or gate last techniques. Furthermore, the devices may include either a planar structure or a fin structure as is well known in the art. In the case of planar devices, as shown, the n-FET 108 and the p-FET 110 may include a gate formed on top of the SOI layer 106. The gate may further include a pair of dielectric spacers formed by conformally depositing a dielectric, followed by an anisotropic etch that removes the dielectric from the horizontal surfaces of the structure 100 while leaving it on the sidewalls of the gate. The n-FET 108 and a p-FET 110 may each include a source region and a drain region formed in the SOI layer 106 using any implant technique known in the art. The source and drain regions may be formed from doped wells as described above. For purposes of illustration only, the source and drain regions are depicted in the SOI layer 106 immediately adjacent to the pair of spacers of each device; however, the source-drain regions spacers may in some cases extend beneath the dielectric spacers or the gate. Alternatively, in one embodiment, the source and drain regions may be raised above the SOI layer 106 (not shown). The structure 100 may also include an isolation structure (not shown) situated between the two devices to electrically insulate them from one another. For example, a shallow trench isolation structure may be formed in the SOI layer 106 between two adjacent devices. The shallow trench isolation structure may include a trench filled with a dielectric material.

With continued reference to FIG. 1, an implant technique 112 may be used to introduce a dopant in a region 114 of the substrate 101. The region 114 may generally include any area of the substrate 101 in which a TSV may subsequently be formed. The region 114 may be larger or smaller than the width or diameter of a subsequently formed TSV. In the present embodiment, the dopant may be implanted into a top surface of the SOI layer 106 within the region 114. Once implanted, the dopant may react with elements, namely silicon and oxygen, of the SOI layer 106 and the base substrate 102 to form a gettering agent. The gettering agent may be used to prevent the contamination of the substrate 101 by the impurities. The impurities may generally refer to mobile ions typically present during semiconductor fabrication such as, but not limited to, potassium and sodium, as described above. The gettering agent may include a pentavalent ion which may attract the impurities, and thereby prevent or impair their diffusion into the substrate. Preventing or impairing the diffusion of the impurities into the substrate 101 may avoid contaminating the substrate 101 and damaging the n-FET 108 or the p-FET 110.

In the present embodiment, the dopant used to implant the region 114 may include arsenic. The arsenic dopant may react with silicon and oxygen of the SOI layer 106, and form a pentavalent ion containing arsenic and oxygen. This pentavalent ion may otherwise be referred to as the gettering agent. The arsenic containing pentavalent ion typically becomes negatively charged in the SOI layer 106 matrix. The arsenic may attract positively charged impurities, such as sodium or potassium, therefore preventing or limiting their diffusion into the substrate 101.

Arsenic is a particularly attractive dopant because it may typically be used to implant the source-drain regions of an n-FET device. For example, in the present embodiment, the implant technique 112 may be used to simultaneously implant both the region 114 of substrate 101 and the source-drain regions of the n-FET 108 with arsenic. The region 114 and the source-drain regions of the n-FET 108 may be implanted with arsenic at the same time using the same implant technique. Therefore, implanting the region 114 with arsenic may be accomplished without any additional steps, and while using current fabrication process flows. In on embodiment, phosphorous may be used as the dopant, and have a similar effect as arsenic described above.

Any suitable lithography mask, for example a mask 116, may be applied above the structure 100, and then subsequently patterned to establish one or more openings. The openings in the mask 116 may generally define selected areas of the structure 100 intended to be implanted by the implant technique 112. Similarly, the mask 116 may be used to prevent implantation of other selective areas of the structure 100. Further, the openings in the mask 116 may define the region 114 and the source-drain regions of the n-FET 108. Alternatively, the source-drain regions of the n-FET 108 may be implanted independently from the region 114, in which two different masking steps may be used. The mask 116 may include well known photoresist materials, for example, a soft mask, and could be either positive or negative in tone.

A blanket implant technique, for example the implant technique 112, may be used to implant the source-drain regions of the n-FET 108 and the region 114. Suitable implant techniques may include, but are not limited to, ion implantation, gas phase doping, plasma doping, plasma immersion ion implantation, cluster doping, infusion doping, liquid phase doping, solid phase doping, or any suitable combination of those techniques. In one embodiment, arsenic may be implanted by one or more rounds of ion implantation. In doing so, arsenic may be introduced into the substrate 101 to form the source-drain regions of the n-FET 108 and the doped region 114.

Generally, any concentration and implant depth may be suitable to introduce the dopant into the SOI layer 106 within the region 114. In one embodiment, the concentration may be similar to known concentrations typically used to form the source-drain regions of the n-FET 108. In one embodiment, the concentration of the dopant may range from about $1.0 \times 10^{17}/cm^3$ to about $1.0 \times 10^{20}/cm^3$. Similarly, any known implant dose and implant energy suitable for the formation of the source-drain regions of the n-FET 108 may be used. Implant depth may not be critical; however, any implant depth that which results from the typical implantation of the source-drain regions of the n-FET 108 may be adequate.

The structure 100 may subsequently experience one or more thermal processes including increase temperatures, for example an activation annealing technique. These thermal processes may encourage the diffusion of the implanted ions, for example the dopant, and thus may affect the concentration and depth. Any subsequent thermal process or annealing technique may have little if any affect in the function of the dopant within the region 114.

In an alternative embodiment, the dopant may be introduced into the substrate 101 by growing an in-situ doped epitaxial region (not shown) on top of the SOI layer 106. The in-situ doped epitaxial region may be formed by selective epitaxial silicon growth above the region 114. The epitaxy film can be doped with the dopant in-situ, for example during the epitaxial growth.

Figure 2:
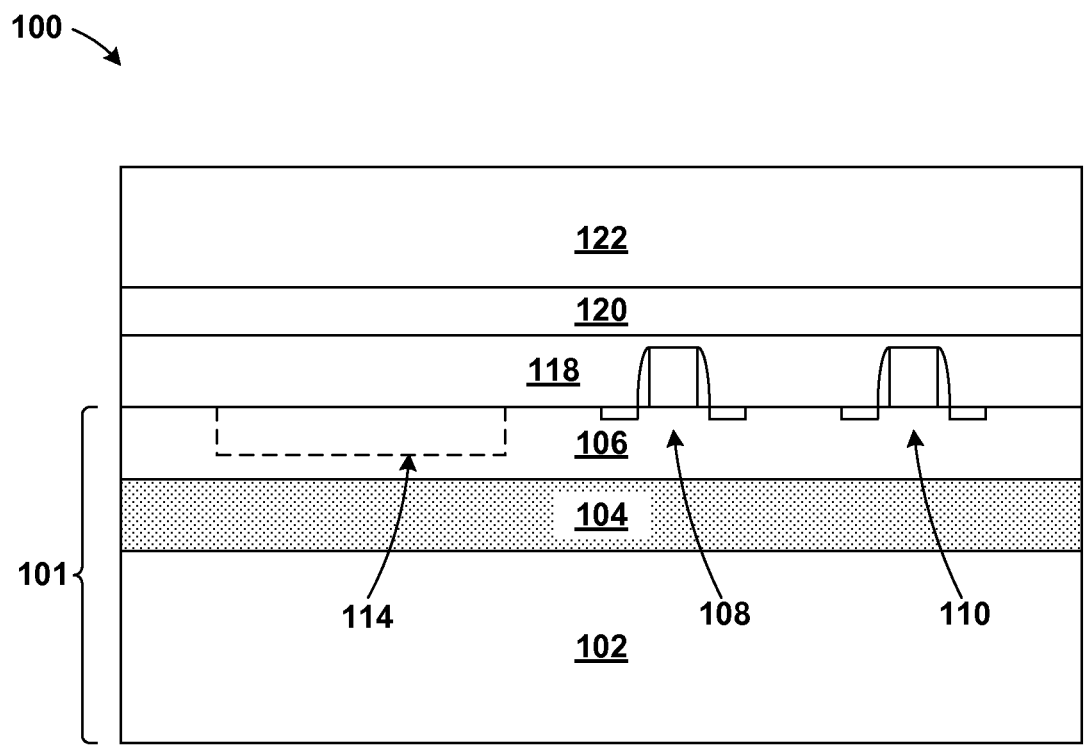

Now referring to FIG. 2, a dielectric layer 118 and a barrier layer 120 may be deposited above the structure 100. Next, one or more interconnect levels, for example the interconnect level 122, may be fabricated above the barrier layer 120. It should be noted that while only a single interconnect level is shown, the structure 100 may have multiple interconnect levels above and below the interconnect level 122. Each interconnect level may include a plurality of conductive lines separated from one another by an insulating material, also referred to as an inter-level dielectric (ILD). The conductive lines in immediately neighboring horizontal interconnect levels may be connected vertically in predetermined places by vias formed between the conductive lines.

Fabrication of each interconnect level may include multiple process steps and generally conclude with a chemical mechanical polishing step used to remove excess material and prepare the surface of a preceding interconnect level to accept a succeeding interconnect level. As mentioned above, process techniques known in the art, for example the chemical mechanical polishing technique, may include the use of elements such as potassium and sodium. As described above, devices formed in the SOI layer 106 may be sensitive to influences of impurity contamination by elements such as potassium and sodium. The barrier layer 120 may be included specifically to prevent impurities, such as potassium and sodium, from contaminating the substrate 101 and affecting the functionality of the devices formed in the SOI layer 106; however, the formation of a TSV provides a direct path through the barrier layer 120 for impurities from the interconnect level 122 to access the substrate 101.

The barrier layer 120 may include an insulating material such as, for example, silicon nitride. The barrier layer 120 may be formed using conventional deposition methods, for example, low-pressure chemical vapor deposition (LPCVD). The barrier layer 120 may have a thickness ranging from about 10 nm to about 500 nm. In one particular embodiment, the barrier layer 120 may be about 100 nm thick. Optionally, a thin (2 nm to 10 nm, preferably 5 nm) thermal oxide layer (not shown) may be formed on the SOI layer 106 prior to forming the barrier layer 120.

Figure 3:
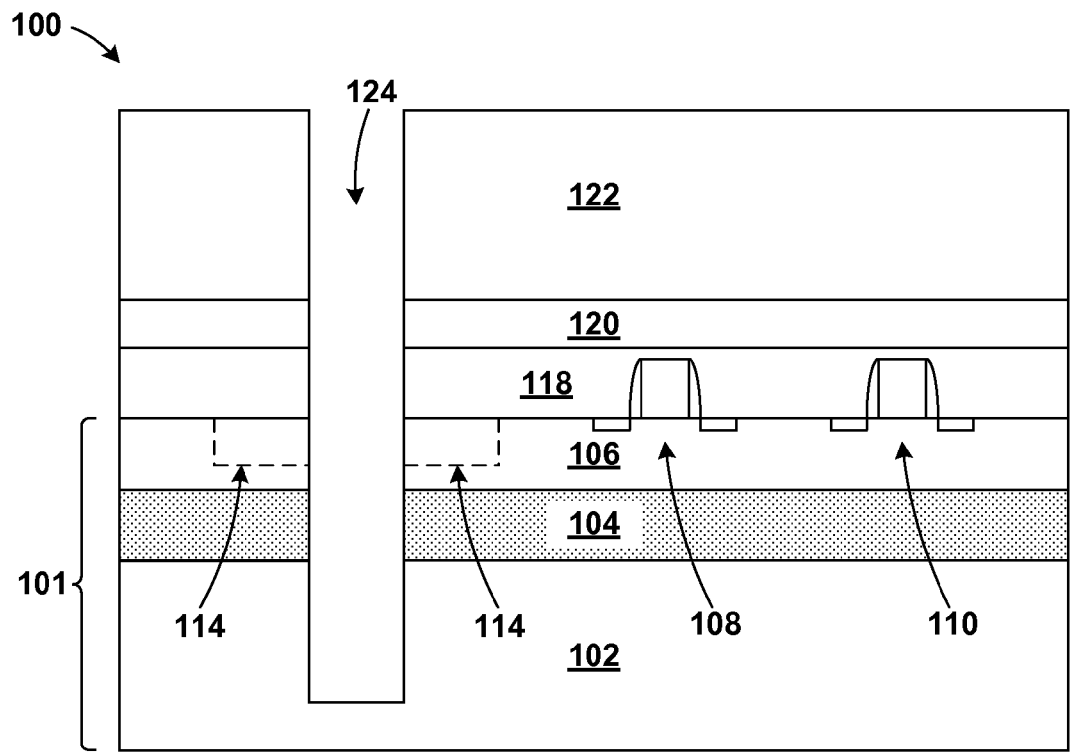

Referring now to FIG. 3, a deep trench 124 may then be formed in the substrate 101 using known patterning techniques, such as for example, a lithography technique followed by an etching technique. The deep trench may intentionally pass through the region 114. The term "deep trench" may denote a trench formed in the structure 100 having a sufficient depth to form a TSV. As such, the deep trench 124 may denote a trench having a depth equal to or greater than 55 microns, whereas a shallow trench may typically refer to a trench having a depth less than 1 micron. While the present embodiment may be described with a deep trench, the present embodiment may be employed with a trench having any depth into the substrate 101.

The substrate 101 may be exposed to the impurities, for example potassium and sodium, during etching of the deep trench 124, as described above. Similarly, during the etching of the deep trench 124, the dopant may be re-distributed throughout the deep trench 124 along with the impurities. Therefore, the gettering agent may form throughout the deep trench 124 and thereby attract the impurities, trapping them in the deep trench 124. Contamination of the substrate 101 from within the deep trench 124 may be limited or prevented due to the presence of the gettering agent formed by the implantation of the dopant, in this case arsenic.

Figure 4:
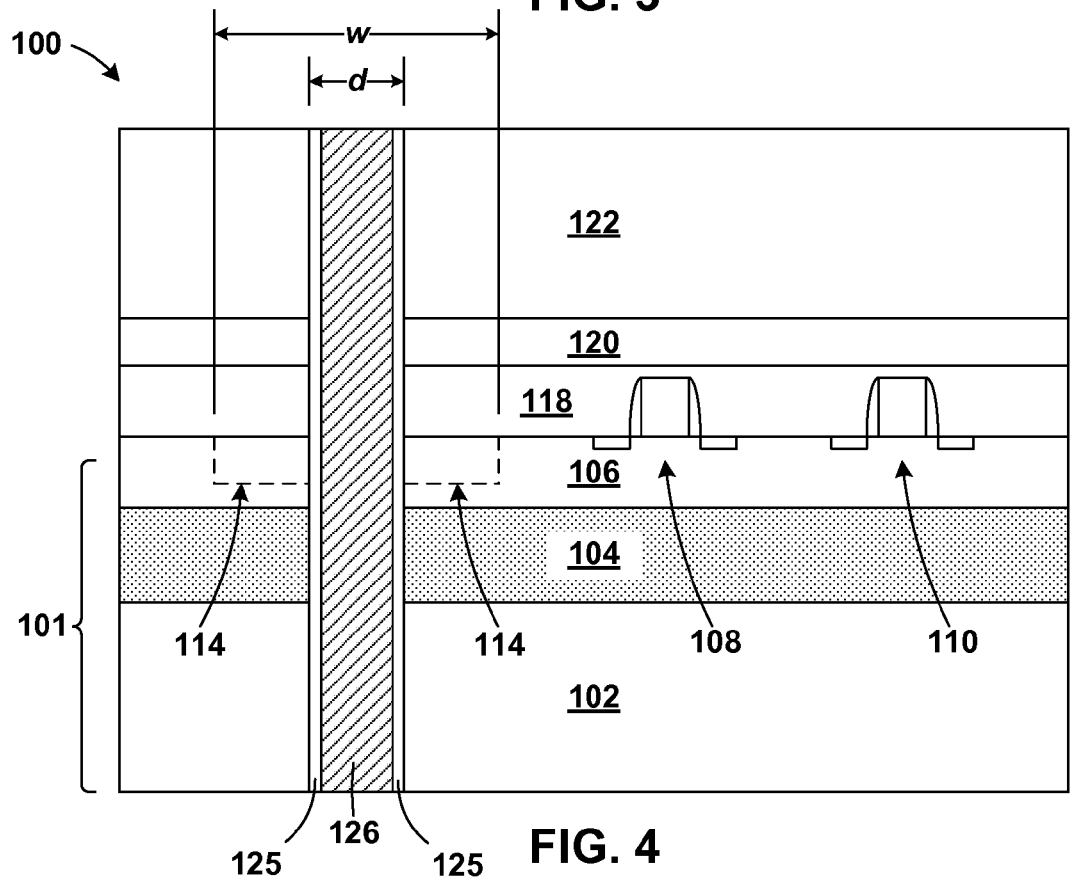

Referring now to FIG. 4, the deep trench may be filled with a conductive material to form a TSV 126 which extends through the region 114. FIG. 4 may represent the final structure 100 having a TSV 126 formed through the region 114 containing the gettering agent formed from the dopant, for example the pentavalent ion containing oxygen and arsenic. In one embodiment, a barrier liner 125 may be conformally deposited within the deep trench 124 (FIG. 3) prior to filling the deep trench 124 (FIG. 3) with the conductive material. More specifically, the barrier liner 125 may be formed along a sidewall and a bottom of the deep trench 124 (FIG. 3). One barrier liner may include, for example, tantalum nitride (TaN), followed by an additional layer including tantalum (Ta). Other barrier liners may include cobalt (Co), or ruthenium (Ru) either alone or in combination with any other suitable liner. The conductive material may include, for example, copper (Cu), aluminum (Al), or tungsten (W). The conductive interconnect material may be formed using a filling technique such as electroplating, electroless plating, chemical vapor deposition, physical vapor deposition or a combination of methods. The conductive interconnect material may alternatively include a dopant, such as, for example, manganese (Mn), magnesium (Mg), copper (Cu), aluminum (Al) or other known dopants. A seed layer (not shown) may optionally be deposited using any suitable deposition technique, for example chemical vapor deposition or physical vapor deposition, prior to filling the trench. The seed layer may also include similar dopants as the conductive interconnect material. After filling the deep trench with the conductive material a chemical mechanical polishing technique may be used to recess the base substrate 102 and exposed the conductive material of the TSV 126. After the chemical mechanical polishing technique, the base substrate 102 may have a thickness less than 1.5 mm.

In the present embodiment, it should be noted that the region 114 is larger than the TSV 126. For example, a width (w) of the region 114 is greater than a diameter (d), or width, of the TSV 126. Forming the region 114 larger than the diameter, or width, of the TSV 126 will ensure that a sufficient amount of the gettering agent is formed and available to attract the impurities during formation of the TSV 126, as described above. In embodiment, the cylindrical TSV, such as the TSV 126, may have a diameter ranging from about 0.2 μm to about 25 μm. In an alternative embodiment, an annular TSV may have a diameter ranging from about 6 μm to about 25 μm, and have a wall thickness ranging from about 1 μm to about 6 μm.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    introducing a dopant into a region of a substrate;
    etching a deep trench in the substrate through the region;
    gettering impurities introduced during etching of the deep trench using a pentavalent ion formed from a reaction between an element of the substrate and the dopant, wherein the charge of the pentavalent ion attracts the impurities; and
    filling the deep trench with a conductive material.

2. The method of claim 1, wherein the region is larger than a diameter of the deep trench.

3. The method of claim 1, wherein the dopant comprises arsenic.

4. The method of claim 1, further comprising:
    implanting a source-drain region of an n-type device with the dopant.

5. The method of claim 1, further comprising:
    forming a barrier liner along a sidewall and a bottom of the deep trench, the barrier liner separates the substrate from the conductive material.

6. The method of claim 1, wherein the deep trench is etched in close proximity to a p-type device.

7. The method of claim 1, further comprising:
    forming an interconnect level above the substrate.

8. The method of claim 1, wherein the pentavalent ion is formed from a reaction between silicon or oxygen of the substrate and the dopant.

9. The method of claim 1, wherein the impurities include potassium, sodium, or both.

10. A method comprising:
    implanting, simultaneously, a region of a substrate and a source-drain region of an n-type device with a dopant, the region being adjacent to a p-type device;
    etching a deep trench in the substrate through the region;
    gettering impurities introduced during etching of the deep trench using a pentavalent ion formed from a reaction between an element of the substrate and the dopant, wherein the charge of the pentavalent ion attracts the impurities; and
    filling the deep trench with a conductive material.

11. The method of claim 10, wherein the region is larger than a diameter of the deep trench.

12. The method of claim 10, wherein the dopant comprises arsenic.

13. The method of claim 10, further comprising:
    forming a barrier liner along a sidewall and a bottom of the deep trench, the barrier liner separates the substrate from the conductive material.

14. The method of claim 10, further comprising:
    forming an interconnect level above the substrate.

15. The method of claim 10, wherein the pentavalent ion is formed from a reaction between silicon or oxygen of the substrate and the dopant.

16. The method of claim 10, wherein the impurities include potassium, sodium, or both.

17. A method comprising:
    introducing a dopant into a region of a substrate;
    etching a deep trench in the substrate through the region; and gettering impurities introduced during etching of the deep trench using a pentavalent ion formed from a reaction between an element of the substrate and the dopant.

18. The method of claim 17, wherein the pentavalent ion is formed from a reaction between silicon or oxygen of the substrate and the dopant.

19. The method of claim 17, wherein the impurities include potassium, sodium, or both.

20. The method of claim 17, wherein the charge of the pentavalent ion attracts the impurities.

* * * * *